April 21, 1964 D. J. ROTIER ETAL 3,130,375

AUTOMATIC FREQUENCY CONTROL APPARATUS

Filed March 1, 1961 3 Sheets-Sheet 1

INVENTOR.
DONALD J. ROTIER
BY JOHN F. STORM

Roger W. Hensen

ATTORNEY

April 21, 1964 D. J. ROTIER ETAL 3,130,375

AUTOMATIC FREQUENCY CONTROL APPARATUS

Filed March 1, 1961 3 Sheets-Sheet 2

INVENTORS.
DONALD J. ROTIER
JOHN F. STORM

BY Roger W. Jensen

ATTORNEY

*INVENTORS.*
DONALD J. ROTIER
JOHN F. STORM
*BY* Roger W. Jensen
ATTORNEY

United States Patent Office 3,130,375

Patented Apr. 21, 1964

3,130,375

AUTOMATIC FREQUENCY CONTROL APPARATUS

Donald J. Rotier, Crystal, and John F. Storm, Minneapolis, Minn., assignors to Minneapolis-Honeywell Regulator Company, Minneapolis, Minn., a corporation of Delaware Filed Mar. 1, 1961, Ser. No. 92,685
13 Claims. (Cl. 331—11)

This invention relates to control apparatus and more particularly to synchronizers having substantially zero drift. A synchronizer is an electronic device which has a D.C. voltage output that represents a level on the input, or which maintains indefinitely an output which represents the input at the time the input was removed.

The invention comprises a fixed frequency pulse oscillator and a variable frequency pulse oscillator, the outputs of which drive a bistable, or flip-flop, circuit. The flip-flop produces either a positive or negative output depending upon which state it is in. The frequency of the variable frequency oscillator is normally the same as the fixed frequency oscillator and is variable in response to a D.C. input signal so that the time average of the flip-flop output is controllable by varying the phase relationship between the pulses from the two oscillators.

A comparator is connected to the outputs of the two oscillators and produces an output indicative of the phase difference between the oscillator signals. Whenever the input signal to the variable frequency oscillator is removed, the output of the comparator is connected to this oscillator to prevent oscillator drift. This stabilizes the output of the flip-flop circuit and holds the flip-flop output at whatever value it was at when the input to the variable frequency oscillator was removed.

It is one object of this invention, therefore, to provide a solid state electronic synchronizer.

Another object of this invention is to provide a synchronizer having substantially zero drift.

These and other objects of our invention will become apparent to those skilled in the art upon consideration of the accompanying specification, claims, and drawings of which:

Figure 1:
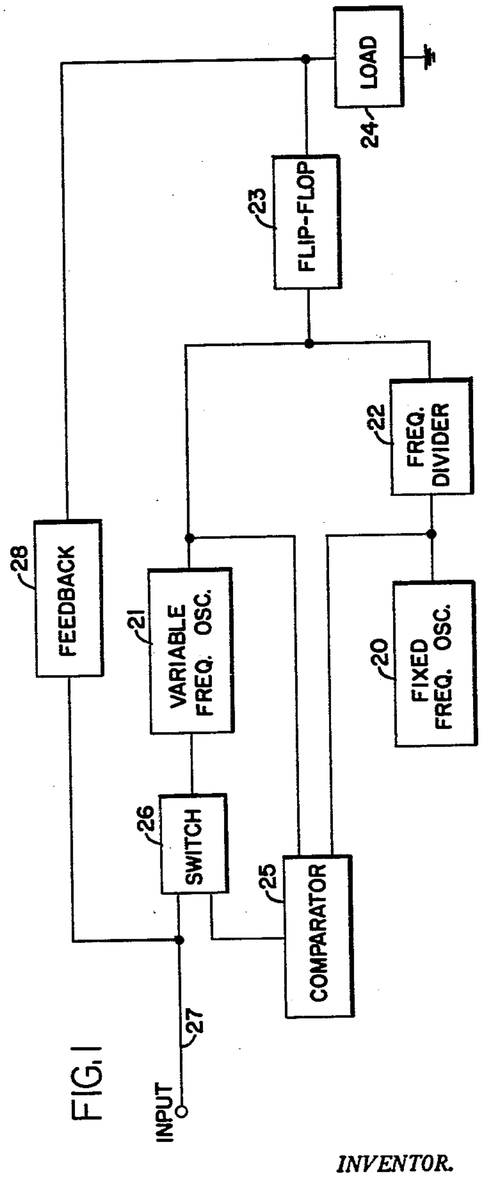
FIGURE 1 is a block diagram of one embodiment of this invention.
Figure 2:
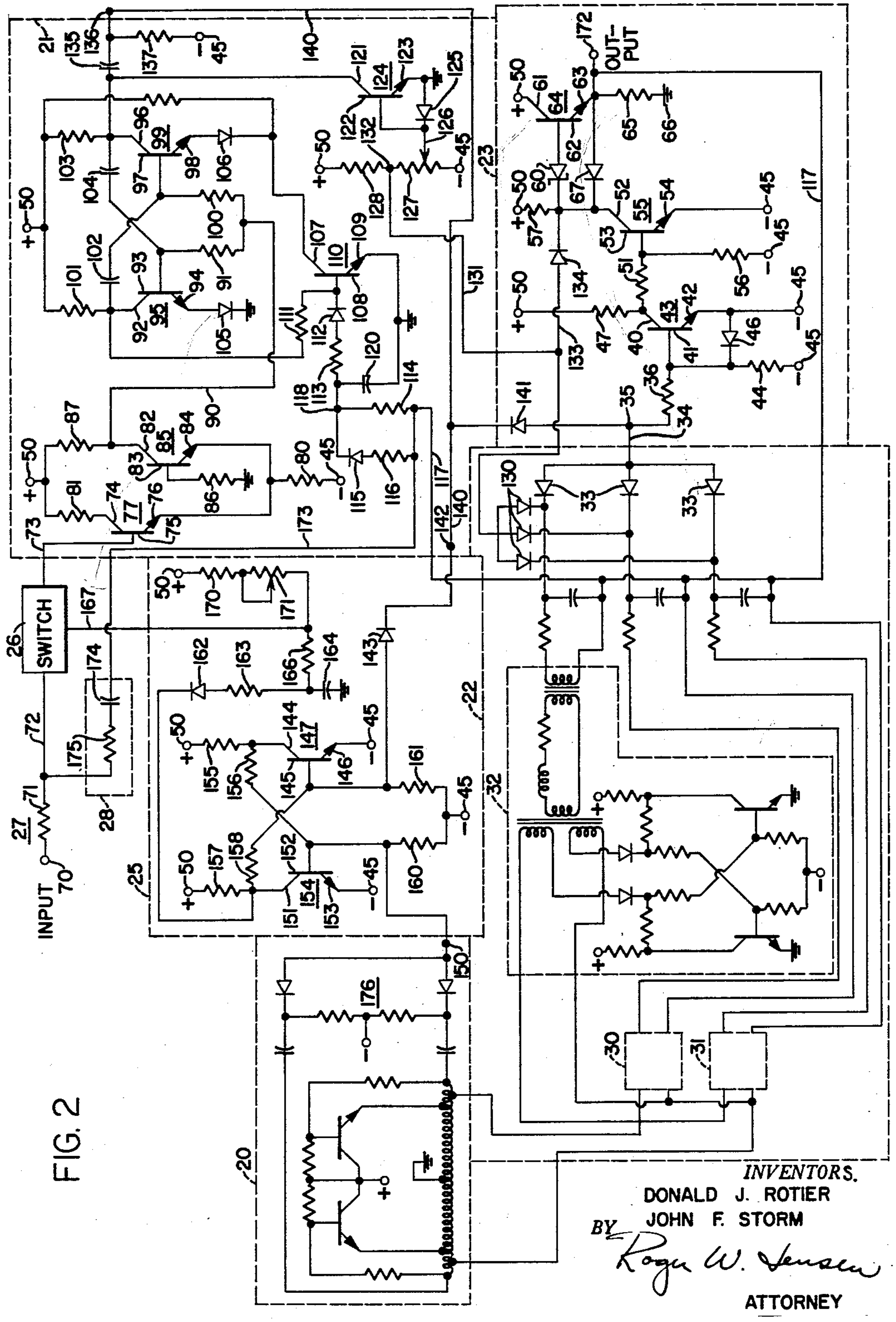
FIGURE 2 is a schematic digram of an embodiment of this invention.

FIGURE 3 (divided into two portions 3A and 3B) is a table showing voltages which appear at various points in FIGURES 1 and 2.

Referring to FIGURE 1 there is shown a fixed frequency oscillator 20 and a variable frequency oscillator 21. The output of the fixed frequency oscillator 20 is fed through a frequency divider 22 to the input of a bistable circuit, or flip-flop, 23. The output of the variable frequency oscillator 21 is also connected to the input of flip-flop 23. Flip-flop 23 delivers a positive or a negative output depending upon which of its stable states it is in. The output of flip-flop 23 is connected to a load 24. The outputs of oscillators 20 and 21 are also connected to the input of a comparator 25. Comparator 25 produces an output which is proportional to the phase difference between the pulses from the fixed frequency oscillator 20 and the variable frequency oscillator 21. The output of comparator 25 is connected to a switching device 26. An input circuit 27 is also connected to switching device 26. The output of switching device 26 is connected to the input of the variable frequency oscillator 21. Switching device 26 operates so as to connect input circuit 27 to the input of the variable frequency oscillator whenever an input signal is applied to input circuit 27, and to apply the output of comparator 25 to the input of the variable frequency oscillator whenever an input signal is not applied to input circuit 27. A feedback circuit 28 is connected from the output of flip-flop 23 to the input circuit 27. Feedback circuit 28 produces a degenerative feedback to the input circuit to control the rate of change of the frequency of the variable frequency oscillator 21 in response to an input signal.

Referring to FIGURE 2 there is shown the fixed frequency oscillator 20. Oscillator 20 is a square-wave oscillator and is similar to the type disclosed in the Locanthi et al. Patent 2,948,841.

The output of oscillator 20 is fed to the frequency divider 22 comprising three parallel connected counters 30, 31, and 32, which deliver one output pulse for every N input pulses. Each of the counters 30, 31, and 32, require a different number of input pulses to produce an output. The output of counters 30, 31 and 32 are connected to an "and" gate 33, such that there will be an output from the "and" gate only when the output of the three counters are in coincidence. Therefore, the pulse output frequency of the "and" gate will be equal to the frequency of oscillator 20 divided by the product of the three counters. For example, in one successful embodiment of the invention, oscillator 20 was operated at a frequency of 20 kc. and counter 30 was a five count, that is, it produced one output pulse per every five input pulses, counter 31 was a six count, and counter 32 was a seven count. In this case the output from the "and" gate was 20,000 divided by 210, ($5\times6\times7=210$) or approximately 95 pulses per second. Counters 30, 31 and 32 are explained in detail in a copending application of Donald J. Rotier entitled "Control Apparatus," filed March 1, 1961, Serial No. 92,684.

Fixed frequency oscillator 20, frequency divider 22 and "and" gate 33 comprise a second fixed frequency oscillator having an output frequency of approximately 95 p.p.s.

The output of "and" gate 33 is connected to an input terminal 35 of flip-flop 23 by means of a conductor 34. Input terminal 35 of flip-flop 23 is connected by means of a resistor 36 to a base 41 of a transistor 43. Transistor 43 further has a collector 40 and an emitter 42. Base 41 of transistor 43 is connected by means of a resistor 44 to a negative source of energizing potential 45. Emitter 42 of transistor 43 is connected to the negative source of energizing potential 45, and, by means of a diode 46, to the base 41. Collector 40 of transistor 43 is connected by means of a resistor 47 to a positive source of energizing potential 50, and by means of a resistor 51 to a base 53 of a transistor 55. Transistor 55 further has a collector 52 and an emitter 54. Base 53 of transistor 55 is connected by means of a resistor 56 to the negative potential source 45. Emitter 54 of transistor 55 is directly connected to the negative potential source 45. Collector 52 of transistor 55 is connected by means of a resistor 57 to the positive potential source 50, and by means of a Zener diode 60 to a base 62 of a transistor 64. Transistor 64 further has a collector 61 and an emitter 63. Collector 61 of transistor 64 is directly connected to the positive potential source 50, while emitter 63 is connected by means of a resistor 65 to a reference potential, in this case ground 66. Emitter 63 of transistor 64 is further connected by means of a diode 67 to the collector 52 of transistor 55.

An input terminal 70 of input circuit 27 is connected by means of a resistor 71 to an input terminal 72 of switch 26. An output terminal 73 of switch 26 is connected to a base 75 of an input transistor 77 at the input of the variable frequency oscillator 21. Transistor 77 further has a collector 74 and an emitter 76. Emitter 76 of transistor 77 is connected by means of a resistor 80 to the negative potential source 45, while collector 74 of transistor 77 is connected by means of a resistor 81 to the positive potential source 50. Emitter 76 of transistor 77 is further directly connected to an emitter 84 of a transistor 85. Transistor 85 further has a collector 82 and a base 83. Base 83 of transistor 85 is directly connected to ground by means of a resistor 86. The collector 82 of transistor 85 is connected by means of a resistor 87 to the positive potential source 50. Collector 82 of transistor 85 is connected by means on a conductor 90 in series with a resistor 91 to a base 93 of a transistor 95, and by means of conductor 90 in series with a resistor 100 to a base 97 of a transistor 99. Transistor 95 further has a collector 92 and an emitter 94, and transistor 99 further has a collector 96 and an emitter 98. Collector 92 of transistor 95 is connected by means of a resistor 101 to the positive potential source 50 and by means of a capacitor 102 to the base 97 of transistor 99. Collector 96 of transistor 99 is connected by means of a resistor 103 to the positive potential source 50 and by means of a capacitor 104 to the base 93 of transistor 95. Emitter 94 of transistor 95 is connected by means of a diode 105 to ground. Emitter 98 of transistor 99 is connected by means of a diode 106 to a collector 107 of transistor 110. Transistor 110 further has a base 108 and an emitter 109. Emitter 109 of transistor 110 is connected directly to ground. Base 108 of transistor 110 is connected by means of a resistor 111 to the collector 92 of transistor 95. Base 108 of transistor 110 is further connected by means of a diode 112, resistor 113, resistor 114 in parallel with series connected diode 115 and resistor 116, and conductor 117 to the emitter 63 of transistor 64. A junction 118 between resistors 113 and 114 is connected by means of capacitor 120 to ground.

Collector 96 of transistor 99 is directly connected to a collector 121 of a transistor 124. Transistor 124 further has a base 122 and an emitter 123. Emitter 123 of transistor 124 is connected directly to ground. Base 122 of transistor 124 is connected to ground, by means of a diode 125, and to an arm 126 of a potentiometer 127. Potentiometer 127 is connected in series with resistor 128 between the positive potential source 50 and the negative potential source 45.

Collector 96 of transistor 99 is further connected by means of a capacitor 135 to an output terminal 136 of variable frequency oscillator 21. The output terminal 136 of variable frequency oscillator 21 is connected by means of a resistor 137 to the negative potential source 45, and by means of a conductor 140 and a diode 141 to the input terminal 35 of flip-flop 23.

The output of counters 30, 31, and 32 are connected to a second "and" gate 130. The output of "and" gate 130 is connected by means of a conductor 131 to a junction 132 between resistor 128 and potentiometer 127, and by means of a conductor 133 and a diode 134 to the collector 52 of transistor 55.

Output terminal 136 of variable frequency oscillator 21 is connected by means of conductor 140 to an input terminal 142 of comparator 25. Terminal 142 of comparator 25 is connected by means of a diode 143 to a base 145 of a transistor 147. Transistor 147 further has a collector 144 and an emitter 146. Emitter 146 of transistor 147 is directly connected to the negative potential source 45. A second input terminal 150 of comparator 25 is connected to a base 152 of a transistor 154. Transistor 154 further has a collector 151 and an emitter 153. Emitter 153 of transistor 154 is directly connected to the negative potential source 45. Collector 144 of transistor 147 is connected by means of a resistor 155 to the positive potential source 50, and by means of a resistor 156 to the base 152 of transistor 154. Collector 151 of transistor 154 is connected by means of a resistor 157 to the positive potential source 50, and by means of a resistor 158 to the base 145 of transistor 147. Base 152 of transistor 154 is connected to the negative potential source by means of a resistor 160, and base 145 of transistor 147 is connected to the negative potential source by a resistor 161. Collector 151 of transistor 154 is further connected by means of a diode 162, resistor 163 and capacitor 164 to ground.

Junction 165 between resistor 163 and capacitor 164 is connected by means of a resistor 166 to an input terminal 167 of switch 26. Positive potential source 50 is connected by means of a resistor 170 in series with a rheostat 171 to input terminal 167 of switch 26.

Inverter 20 is connected by means of an "or" gate 176 to input terminal 150 of comparator 125.

Collector 63 of transistor 64 is connected to an output terminal 172, and by means of conductor 117, a conductor 173, a capacitor 174 and resistor 175 of a feedback network 28, to terminal 72 of switch 26.

*Operation*

In considering the operation of the circuit of FIGURE 2, assume that initially there is no input signal applied to input terminal 70. Assume further that oscillator 20 is operating at a frequency of 20 kc. and that the nominal frequency of the VFO 21 is 95 pulses per second.

The 20 kc. pulses coming from oscillator 20 are fed to the inputs of counters 30, 31 and 32. As explained previously, counter 30 is a five count, counter 31 is a six count, and counter 32 is a seven count. The outputs of counters 30, 31 and 32 are fed to the input of "and" gate 33. "And" gate 33 will produce an output only when there is coincidence between the signals applied to its inputs, and hence the output of "and" gate 33 will be a series of positive pulses at a frequency of approximately 95 pulses per second.

The positive pulses from the output of "and" gate 33 are fed by way of conductor 34 and resistor 36 to the base 41 of transistor 43. These positive pulses turn transistor 43 "on." When transistor 43 turns "on" the voltage at the collector 40 of transistor 43 goes negative and this negative going voltage is coupled through resistor 51 to the base 53 of transistor 55, turning transistor 55 "off." As transistor 55 goes "off" the voltage at its collector 52 goes positive, and this positive voltage is coupled through Zener diode 60 to the base 62 of transistor 64, turning on transistor 64. As transistor 64 conducts, the voltage at its emitter 63 goes positive to a value substantially equal to the positive potential source 50. This positive voltage on the emitter 63 of transistor 64 is coupled to the output terminal 172. When the output 172 of flip-flop 23 is positive, this positive voltage will be coupled through conductor 117 and the output circuits of counters 30, 31 and 32 to the input of "and" gate 33, blocking these inputs and hence producing a positive output from "and" gate 33. This positive output will be coupled to a base 41 of transistor 43 holding flip-flop 23 in its positive state.

The variable frequency oscillator 21 comprises an astable multivibrator having a nominal frequency, that is with no input signal applied to input terminal 70, of approximately 95 pulses per second. The astable multivibrator is of the type described in the "Handbook of Semiconductor Electronics" edited by Hunter, McGraw Hill, 1956, page 14–22, Figure 14.23A.

The pulses from the collector 96 of transistor 99 are fed through capacitor 135, conductor 140, diode 141 and resistor 36 to the base 41 of transistor 43. These negative pulses turn "off" transistor 43 which causes the collector 40 of transistor 43 to go positive. The positive rise of the collector of transistor 43 is coupled through resistor 51 to the base 53 of transistor 55, turning "on" transistor 55. When transistor 55 conducts, the collector 52 of transistor 55 goes negative to approximately the value of the negative potential source 45. This negative voltage on the collector 52 of transistor 55 is coupled through Zener diode 60 and turns "off" transistor 64, and is further coupled through diode 67 to the output terminal 72.

It can be seen from the above explanation that the positive pulses from the fixed frequency oscillator cause the output terminal 172 to go positive, while the negative pulses from the variable frequency oscillator causes the output terminal to go negative.

Assume now that a positive D.C. signal is applied to input terminal 70. This positive signal is coupled through resistor 71 and switch 26 to the base 75 of transistor 77, increasing the conduction of transistor 77. The current flow path for transistor 77 is from the positive source 50 through resistor 81, collector 74 to emitter 76 of transistor 77, and resistor 60 to the negative potential source 45. The increased current flow through resistor 80 biases the emitter 84 of transistor 85 more positive and decreases the current flow through transistor 85. The current flow path for transistor 85 is from the positive potential source 50 through resistor 87, collector 82 to emitter 84 of transistor 85 and resistor 80 to the negative potential source 45. The decrease in conduction of transistor 85 causes the collector 82 of transistor 85 to go more positive. This positive potential is coupled through conductor 90 and resistor 91 to the base 94 of transistor 95, and through resistor 100 to the base 97 of transistor 99, and increases the frequency of the astable multivibrator.

The increase in frequency of the variable frequency oscillator 21 results in an increase in frequency of the pulses fed through conductor 140 and diode 141 to the input 35 of flip-flop 23. The increase in frequency of variable frequency oscillator 21 results in a phase difference between the pulses from oscillator 21 and the pulses from the fixed frequency oscillator comprising oscillator 30, frequency divider 22 and "and" gate 33. The phase difference between the pulses from the two oscillators result in a change in the time average of the output of flip-flop 23.

When the input signal is removed from input terminal 70, the variable frequency oscillator 21 returns to its normal frequency, that is, approximately 95 pulses per second, and the phase difference that has been introduced between the pulses from oscillators 21 and 22 remains fixed.

To help explain the operation somewhat more fully, FIGURE 3 shows the outputs of the various circuit parameters and their relation to each other.

Figure 3B:
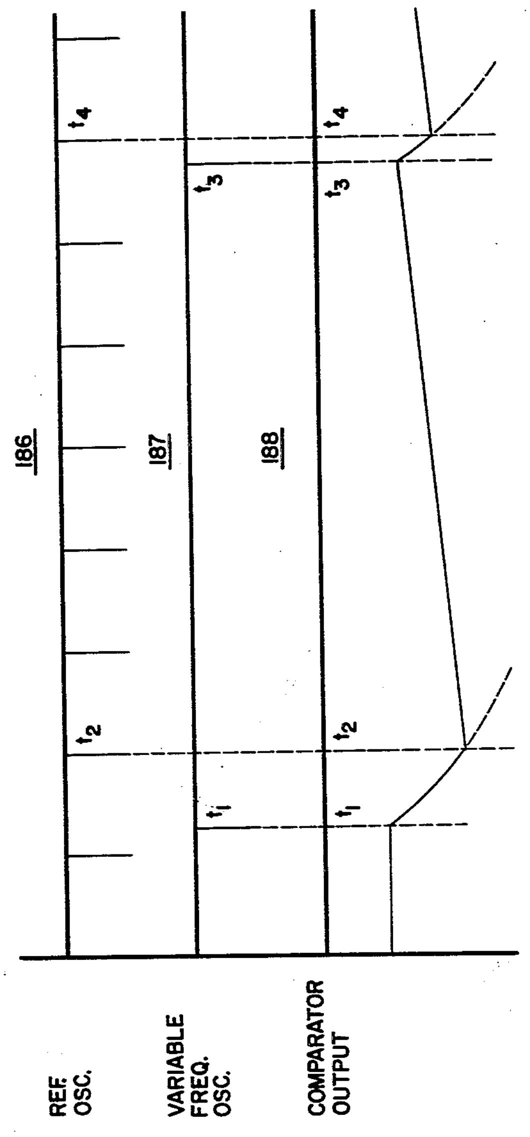
Figure 3A:
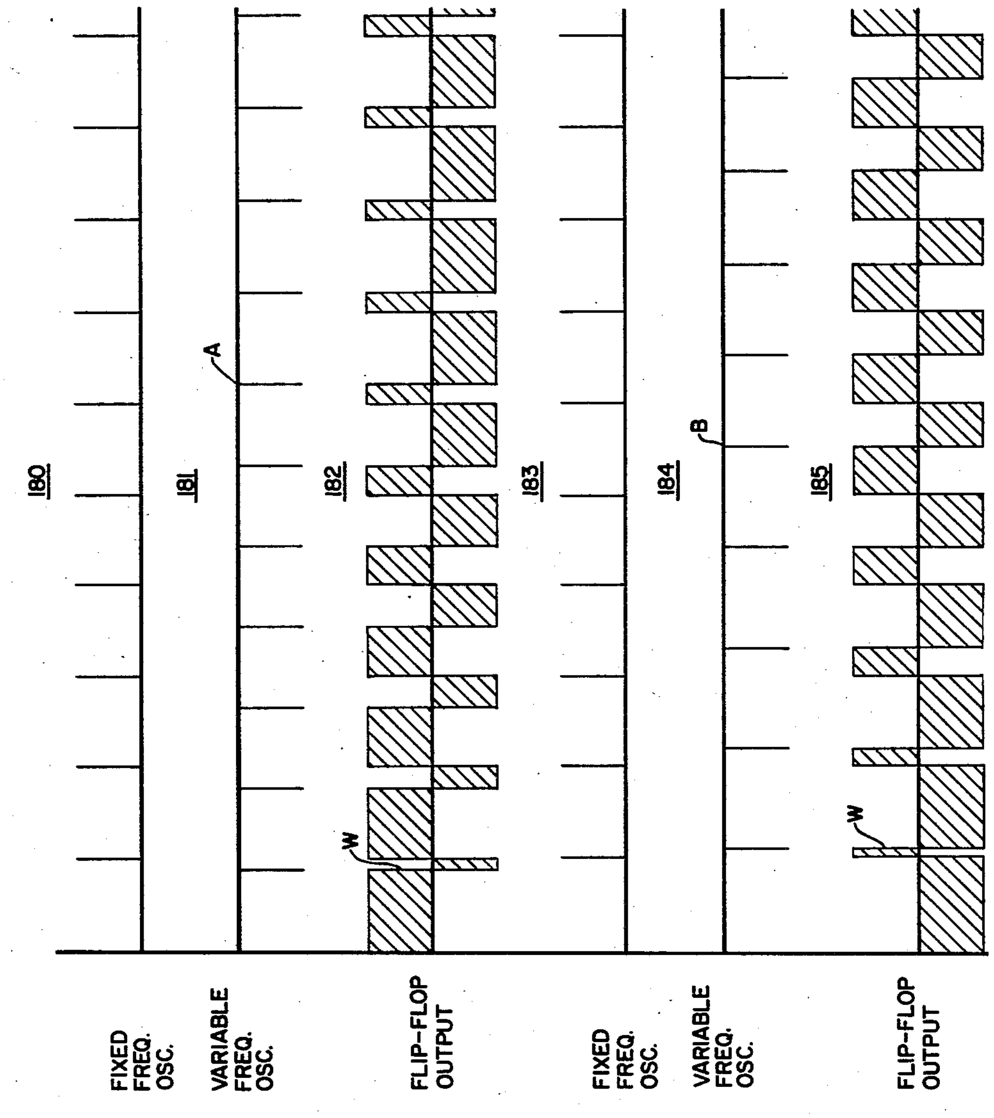

Referring to FIGURE 3A, the graph 180 shows the positive output pulses from the fixed frequency oscillator 21. Graph 181 shows the negative output pulses from variable frequency oscillator 21, and graph 182 shows the output wave form of flip-flop 23.

As shown in graph 181 the variable frequency oscillator has a higher frequency than the fixed frequency oscillator 22. This difference in frequency results in a varying phase difference between the output pulses of the two oscillators. As the phase difference between the oscillator pulses changes, the resulting positive "on" time and negative "on" time of flip-flop 23 also changes. This can be seen from graph 182, where the wave front W changes as the phase difference between the oscillator pulses changes. Wave form W, as shown in graph 182, moves to the left resulting in less positive "on" time and more negative "on" time, or in other words the time average value of a flip-flop output moves from some positive value toward a more negative value.

Point A on graph 181 represents the point where the input signal is removed from input terminal 70, or in other words, the point where variable frequency oscillator 21 returns to its normal frequency. After variable frequency oscillator 21 has returned to its normal frequency the phase difference that was introduced between the output pulses of the two oscillators remains fixed, and the resulting output from flip-flop 23 remains constant. This can be seen again from graph 182, where after point A the time average value of the output wave form remains constant. Similarly, graphs 183, 184 and 185 of FIGURE 3A shows the relationship between the oscillator outputs and the output of flip-flop 23 when the variable frequency oscillator decreases in frequency, or in other words, the wave forms resulting from a negative signal being applied to input terminal 70. The operation of the circuit is the same as previously described except that wave form W of graph 185 will now move to the right instead of to the left as was the case when a positive input signal was applied to input terminal 70.

Feedback network 28 is connected from the output terminal 172 to input 72 of switch 26 and produces a degenerative feedback to control the rate of change of the frequency of the variable frequency oscillator in response to an input signal.

In order to insure proper system operation it is essential that the frequency of the variable frequency oscillator 21 does not change to such an extent that the phase difference between oscillator 20 and oscillator 21 is greater than one period, in other words, that two positive pulses do not occur between subsequent negative pulses and vice versa. A positive and negative end inhibitor are used to insure that the phase difference between the oscillators does not exceed this limit. The negative end inhibitor comprises transistor 110 and its associated circuitry and the positive end inhibitor comprises transistor 124 and its associated circuitry.

The collector 107 of transistor 110 of the negative end inhibitor is connected by means of diode 106 to the emitter 98 of transistor 99 and forms a current path for the emitter current of transistor 99. Base 108 of transistor 110 is connected by means of diode 112, resistor 113, resistor 114, and conductor 117 to the output of flip-flop 23, so that, transistor 110 will conduct only when the output of flip-flop 23 is positive.

Referring to graphs 180, 181 and 182 of FIGURE 3A it can be seen that as the negative pulses of graph 181 move to the left toward coincidence with the positive pulses of graphs 180 that the "on" time of the positive portion of the wave form of graph 182 becomes smaller and smaller. If the negative pulses of graph 180 tend to "cross over" the positive pulses of graph 180 then transistor 110 of the negative end inhibitor will be switched to its "off" or non-conducting state, since the output from the flip-flop 23 will be negative. In other words, it is essential that a positive pulse from the fixed frequency oscillator triggers the flip-flop positive before a negative pulse from the variable frequency oscillator can trigger it negative.

The collector 121 and the emitter 123 of transistor 124 are connected from the output of the astable multivibrator to ground, so that any time transistor 124 is conducting the output of the astable multivbrator is shorted out. The base 122 of transistor 124 is connected to a voltage divider comprising resistor 128 and potentiometer 127. The arm 126 of potentiometer 127 is adjusted so that the base 122 of transistor 124 is slightly negative with respect to emitter 123 when the output of flip-flop 23 is positive. This negative potential on the base of transistor 124 biases this transistor in its "off," or non-conducting state. When the output of flip-flop 23 is negative transistor 124 will be driven further into cutoff. This can be seen from the fact that when the output of flip-flop 23 is negative transistor 55 is conducting and hence the collector 52 of transistor 55 is at approximately the same potential as negative potential source 45. Since collector 52 of transistor 55 is negative a current will flow from positive potential source 50 through transistor 128, junction 132, conductor 131, conductor 133, diode 134, and the collector 52 to emitter 54 of transistor 55 to the negative potential source 45. This current flow will result in a negative potential at terminal 132 of the positive end inhibitor bleeder network. This negative potential at junction 132 drives the base 122 of transistor 124 more negative and hence drives transistor 124 further into cutoff.

Referring to graphs 183, 184, and 185 of FIGURE 3A it can be seen that as the negative pulses from the variable frequency oscillator 21 move toward the right the output from flip-flop 23 becomes more positive, that is, the "on" time of the positive portion of the output waveform increases.

As the negative pulses from the variable frequency oscillator 21 tend to "cross over" the positive pulses from the fixed frequency oscillator, or in other words, the frequency of the negative pulses increases to a point where two positive pulses tend to occur between subsequent negative pulses, the positive pulse from the output of "and" gate 130 is fed through conductor 131 and adds to the positive potential at junction 132 in the bleeder network of the positive end inhibitor. The addition of the positive pulse with the positive potential already present at junction 132 is sufficient to raise the base of transistor 124 out of cutoff and turns transistor 124 "on." The conduction of transistor 124 drops the potential on the collector 96 of transistor 99 of the astable multivibrator, and causes the astable multivibrator to flip and thereby produces a negative pulse at the output of the variable frequency oscillator 21. This negative pulse is fed to the flip-flop 23 and causes flip-flop 23 to change its state, and thereby prevents two positive pulses from occurring between subsequent negative pulses.

Comparator 25 prevents the output of flip-flop 23 from drifting when there is no input signal applied to the synchronizer.

Comparator 25 comprises a bistable multivibrator having two inputs, 142 and 150. Input 142 of comparator 25 is connected by means of conductor 140 to the output 136 of the variable frequency oscillator, while input 150 of comparator 125 is connected to the output of an "or" gate 176. The inputs to "or" gate 176 are connected to each side of the fixed frequency 20 kc. oscillator, and therefore the output of "or" gate 176 will be 40,000 pulses per second, or in other words, one pulse every 25 microseconds.

A pulse at the first input 142 of the comparator multivibrator, that is, from the output of the variable frequency oscillator, shuts off transistor 147 and turns on transistor 154. Capacitor 164 then charges through resistor 163 and diode 162 toward the negative potential source 45. Sometime within 25 microseconds, a pulse will be received at the comparator multivibrator second input 150 which will shut off transistor 154 and will turn on transistor 147, at which time capacitor 164 will discharge through ground, the negative potential source 45, resistor 80, the emitter 76 to base 75 of transistor 77, switch 26, and resistor 176 to the other side of capacitor 164.

Positive potential source 50, resistor 170, and rheostat 174 comprise a bias source for the input to the variable frequency oscillator 21. This bias current flows from positive potential source 50 through resistor 170, potentiometer 171, switch 26, base 75 to emitter 76 of transistor 77, and resistor 80 to the negative potential source 45.

The discharge current of capacitor 164 opposes the bias current from the variable frequency oscillator's bias circuit. It can be seen, therefore, that the longer transistor 154 is left "on" the higher the charge will be on capacitor 164. This charge is determined by the phase relationship between the 95 pulses per second output of the variable frequency oscillator 21 and the 40,000 pulses per second output from "or" gate 176 and fixed frequency oscillator 20. It can be seen that if the phase relationship between the variable frequency oscillator and the fixed frequency oscillator tends to change, for instance, increase, this change in phase will change the "on" time of transistor 154 which in turn will change the charge, and subsequently discharge, current of capacitor 164. The resulting sum of the discharge current from capacitor 164 and the bias circuit for the variable frequency oscillator, decreases the phase relationship between the two oscillators and returns it to its original value.

To help understand the operation of comparator 25, reference is made to graphs 186, 187, and 188 of FIGURE 3B. Graph 186 represents the output pulses from the variable frequency oscillator 21, graph 187 represents the output pulses from the "or" gate 176, and graph 188 represents the charging and discharging wave form of capacitor 164.

As shown in graph 187 of FIGURE 3B at time $t_1$ a negative pulse from the variable frequency oscillator is fed to input 142 of comparator 25 and turns "on" transistor 154 of the comparator multivibrator. At this time capacitor 164 charges through resistor 161 toward the negative potential source 45 as shown in graph 188. Some time within 25 microseconds a negative pulse from the output of the "or" gate 176 will be fed to input 150 of comparator 25. This negative pulse turns "off" transistor 154 and turns "on" transistor 147 of the comparator multivibrator and allows capacitor 164 to discharge. Since resistor 166 in the discharge path of capacitor 164 is very large compared to resistor 163 in the charge path of capacitor 164, the discharge rate of capacitor 164 will be very slow, as shown in graph 188. The negative discharge current of capacitor 164 is summed in the input of the variable frequency oscillator with the positive bias current from the variable frequency oscillator bias circuit so that the operating point of the variable frequency oscillator is determined by the resulting sum of the two bias currents.

Graph 188 shows that at time $t_1$ when the negative pulse from the variable frequency oscillator occurred shortly after the negative pulse from the reference or fixed frequency oscillator, capacitor 164 had a fairly large charge time and therefore the resulting discharge current of capacitor 164 was a high value. Graph 188 further shows at time $t_3$, when a subsequent pulse from the variable frequency oscillator turns "on" transistor 154 of the comparator multivibrator and allows capacitor 164 to charge, that in this case, the charge time of capacitor 164 will be much shorter, since the negative pulse at time $t_3$ from the variable frequency oscillator appears just before a negative pulse at time $t_4$ from the fixed frequency, or reference, oscillator. In this case since the charge time for capacitor 164 was of such a short duration, the resulting discharge current of capacitor 64 will be much smaller and hence the positive bias current from the VFO bias circuit will predominate.

It can be understood from the above explanation of the comparator operation, that the maximum drift of the synchronizer output is limited to within the 25 microsecond period between subsequent pulses from the fixed frequency oscillator 20.

It is to be understood that while we have shown a specific embodiment of our invention, this is for the purpose of illustration only and that our invention is to be limited solely by the scope of the appended claims.

We claim as our invention:

1. Apparatus of the class described comprising: first oscillator means having an output; second oscillator means having an input and output, the phase of said second oscillator means being variable in response to an input signal; means adapted to connect the input of said second oscillator to a source of input signals; bistable means having an input and output; frequency divider means connecting the output of said first oscillator to the input of said bistable means; means connecting the output of said second oscillator to the input of said bistable means; load means connected to the output of said bistable means; phase comparator means having a first and a second input and an output, said phase comparator means producing an output proportional to the difference in phase between signals to its inputs; means connecting the output of said first oscillator to the first input of said comparator; means connecting the output of said second oscillator to the second input of said comparator; and means connecting the output of said comparator to the input of said second oscillator at all times except when an input signal is applied to said second oscillator.

2. Apparatus of the class described comprising: first and second oscillators having substantially the same frequency; input signal means connected to said first oscillator so as to vary the phase of said first oscillator with respect to said second oscillator; bistable means having an input and output; means connecting said first and second oscillators to the input of said bistable means; means adapted to connect the output of said bistable means to a load; a reference oscillator having a substantially higher frequency than said second oscillator; comparator means having input and output terminals, the output of said comparator being indicative of the phase difference between signals applied to its input terminals; means connecting said reference oscillator and said second oscillator to the input terminals of said comparator; and means connecting the output of said comparator to the input of said second oscillator at all times except when an input signal is applied to said second oscillator.

3. Apparatus of the class described comprising: a fixed frequency pulse oscillator; bistable means having an input and an output; means connecting said fixed frequency oscillator to the input of said bistable means; means adapted to connect the output of said bistable means to a load; a variable frequency pulse oscillator having an input and an output and comprising in combination a free-running multivibrator having an input and output and having a frequency that is variable in response to an input signal, means adapted to connect the input of said free-running multivibrator to the input of said variable frequency oscillator, a first inhibitor connected to said free-running multivibrator and said bistable means so as to allow pulses at the output of said free-running multivibrator only when the output of said bistable means is positive, and a second inhibitor connected to said free-running multivibrator, said fixed frequency oscillator, and said bistable means so as to prevent pulses from appearing at the output of said multivibrator, whenever the output of said bistable means is positive and simultaneously a pulse appears at the output of said fixed frequency oscillator; means adapted to connect the input of said variable frequency oscillator to a source of input signals; means connecting the output of said variable frequency oscillator to the input of said bistable means; a reference oscillator having a substantially higher frequency than said variable frequency oscillator; comparator means having input and output terminals, the output of said comparator being indicative of the phase difference between signals applied to its input terminals; means connecting said reference oscillator and said variable frequency oscillator to the input terminals of said comparator means; and means connecting the output of said comparator means; and means connecting the output of said comparator means to the input of said variable frequency oscillator at all times except when an input signal is applied to said second oscillator.

4. Apparatus of the class described comprising: a fixed frequency pulse oscillator; bistable means having an input and output; frequency divider means connected intermediate said fixed frequency oscillator and the input of said bistable means; means adapted to connect the output of said bistable means to a load; a variable frequency pulse oscillator having input and output terminals, the frequency of said variable frequency oscillator being variable in response to an input signal; means adapted to connect the input terminals of said variable frequency oscillator to a source of input signals; means connecting the output terminals of said variable frequency oscillator to the input of said bistable means; comparator means having input and output terminals and comprising in combination a bistable multivibrator, energy storage means, first impedance means connecting said energy storage means to said bistable multivibrator means so that said energy storage means is energized through said first impedance means when said multivibrator is in a first stable state, second impedance means connecting said energy storage means to the input of said comparator means so that said energy storage means is deenergized through said second impedance means when said multivibrator is in a second stable state, and biasing means connected to the output terminals of said comparator said biasing means producing a current that opposes the deenergizing current of said energy storage means; means connecting the output terminals of said comparator to the input of said variable frequency oscillator at all times except when an input signal is applied to the input of said variable frequency oscillator; and means connecting the output of said fixed frequency oscillator and variable frequency oscillator to the input of said comparator so that a pulse from said variable frequency oscillator changes the comparator multivibrator to its first stable state and a pulse from said fixed frequency oscillator changes the comparator multivibrator to its second stable state, the resulting energization of said energy storage means being determined by the phase difference between said fixed frequency oscillator and said variable frequency oscillator.

5. Apparatus of the class described comprising: a first oscillator having a substantially fixed frequency; a second oscillator having an input and output, the frequency of said second oscillator being variable in response to an input signal; bistable means having an input and an output; means connecting said first and second oscillators to the input of said bistable means; means adapted to connect the output of said bistable means to a load; feedback means connected from the output of said bistable means to said second oscillator to control the rate of change of the frequency of said second oscillator; comparator means having an input and an output, said comparator means producing an output proportional to the phase difference between signals applied to its input; means connecting said first and second oscillators to the input of said second comparator; and means connecting the output of said comparator to the input of said second oscillator at all times except when an input signal is applied to said second oscillator.

6. Apparatus of the class described comprising: a first oscillator having a substantially fixed frequency; bistable means having an input and an output; frequency divider means connecting said first oscillator to the input of said bistable means; means adapted to connect the output of said bistable means to a load; a second oscillator having an input and an output, said second oscillator having a frequency that is variable in response to an input signal; means connecting the output of said second oscillator to the input of said bistable means; comparator means having an input and an output, the output of said comparator being indicative of the phase difference between signals applied to its input; means connecting said first and second oscillators to the input of said comparator; an input circuit adapted to be connected to a source of input signals; and switch means adapted to connect either the output of said comparator or said input circuit to the input of said second oscillator.

7. Apparatus of the class described comprising: a fixed frequency pulse oscillator; bistable means having an input and an output; means connecting said fixed frequency oscillator to the input of said bistable means; means adapted to connect the output of said bistable means to a load; a variable frequency pulse oscillator comprising in combination a free-running multivibrator having an input and output and having a frequency that is variable in response to an input signal, means adapted to connect said free-running multivibrator to a source of input signals, a first inhibitor connected to said free-running multivibrator and said bistable means so as to allow pulses at the output of said free-running vibrator only when the output of said bistable means is of a first polarity, and a second inhibitor connected to said free-running multivibrator, said fixed frequency oscillator, and said bistable means so as to prevent pulses from appearing at the output of said multivibrator whenever the output of said bistable means is of a first polarity and simultaneously a pulse appears at the output of said fixed frequency oscillator; a reference oscillator having a substantially higher frequency than said variable frequency oscillator; comparator means having input and output terminals, the output of said comparator being indicative of the phase difference between signals applied to its input terminals; means connecting said reference oscillator and said variable frequency oscillator to the input terminals of said comparator means; and means connecting the output of said comparator means to the input of said variable frequency oscillator at all times except when an input signal is applied to said second oscillator.

8. Apparatus of the class described comprising: a fixed frequency pulse oscillator; bistable means having an input and output; frequency divider means connected intermediate said fixed frequency oscillator and the input of said bistable means; means adapted to connect the output of said bistable means to a load; a variable frequency pulse oscillator having input and output terminals, the frequency of said variable frequency oscillator being variable in response to an input signal; means adapted to connect the input terminals of said variable frequency oscillator to a source of input signals; means connecting the output terminals of said variable frequency oscillator to the input of said bistable means; comparator means having input and output terminals and comprising in combination a bistable multivibrator, capacitance means, first resistance means connecting said capacitance means to said bistable multivibrator means so that said capacitance means is energized through said first resistance means when said multivibrator is in a first stable state, second resistance means connecting said capacitance means to the output of said comparator means so that said energy storage means is deenergized through said second resistance means when said multivibrator is in a second stable state, and biasing means connected to the output terminals of said comparator said biasing means producing a current that opposes the deenergizing current of said capacitance means; means connecting the output terminals of said comparator to the input of said variable frequency oscillator at all times except when an input signal is applied to the input of said variable frequency oscillator; and means connecting the outputs of said fixed frequency oscillator and said variable frequency oscillator to the input of said comparator so that a pulse from said frequency oscillator changes the comparator multivibrator to its first stable state and a pulse from said fixed frequency oscillator changes the comparator multivibrator to its second stable state, the resulting energization of said energy storage means being determined by the phase difference between said fixed frequency oscillator and said variable frequency oscillator.

9. Apparatus of the class described comprising: a first oscillator having a substantially fixed frequency; bistable means having an input and an output; frequency divider means connecting said first oscillator to the input of said bistable means, said frequency divider means comprising in combination a plurality of counters each producing an output pulse in response to a specific number of input pulses, means connecting the input of said counters in parallel, an "and" gate, and means connecting the outputs of said counters to said "and" gate so that said gate produces an output pulse whenever the output pulses from said counters are in coincidence; means adapted to connect the output of said bistable means to a load; a second oscillator having an input and an output, said second oscillator having a frequency that is variable in response to an input signal; means connecting the output of said second oscillator to the input of said bistable means; comparator means having an input and an output, the output of said comparator being indicative of the phase difference between signals applied to its input; means connecting said first and second oscillators to the input of said comparator; an input circuit adapted to be connected to a source of input signals; and switch means adapted to connect either the output of said comparator or said input circuit to the input of said second oscillator.

10. Apparatus of the class described comprising: first pulse oscillator means having an output; second pulse oscillator means having an input and output, the phase of said second oscillator means being variable in response to an input signal; means adapted to connect the input of said second oscillator to a source of input signals; bistable multivibrator means having an input and output; frequency divider means connecting the output of said first oscillator to the input of said multivibrator; means connecting the output of said second oscillator to the input of said multivibrator; load means connected to the output of said multivibrator; degenerative feedback means connected from the output of said multivibrator to the input of said second oscillator to control the rate of change of the frequency of said second oscillator in response to an input signal; phase comparator means having a first and a second input and an output, said phase comparator means producing an output proportional to the difference in phase between signals applied to its inputs; means connecting the output of said first oscillator to the first input of said comparator; means connecting the output of said second oscillator to the second input of said comparator; and means connecting the output of said comparator to the input of said second oscillator at all times except when an input signal is applied to said second oscillator.

11. Apparatus of the class described comprising: a fixed frequency pulse oscillator; a bistable device having an input and an output, said bistable device producing a first polarity output when in its first stable state and an opposite polarity output when in its second stable state; a variable frequency pulse oscillator having an input and an output and having a nominal frequency substantially the same as said fixed frequency oscillator, the frequency of said variable frequency oscillator being variable in response to a signal applied to its input; means connecting the outputs of said fixed and variable frequency oscillators to the input of said bistable device so that a pulse from said fixed frequency oscillator switches said bistable device to its first stable state and a pulse from said variable frequency oscillator switches said bistable device to its second stable state and feedback means connected from the output of said bistable device to the input of said variable frequency pulse oscillator to control the rate of change of the frequency of said variable frequency pulse oscillator in response to an input signal.

12. Apparatus of the class described comprising: a fixed frequency pulse oscillator; bistable means having an input and an output; means connecting said fixed frequency oscillator to the input of said bistable means; means adapted to connect the output of said bistable means to a load; a variable frequency pulse oscillator having an input and an output and comprising in combination a free-running multivibrator having an input and output and having a frequency that is variable in response to an input signal, means adapted to connect the input of said free-running multivibrator to the input of said variable frequency oscillator, a first inhibitor connected to said free-running multivibrator and said bistable means so as to allow pulses at the output of said free-running multivibrator only when the output of said bistable means is positive, and a second inhibitor connected to said free-running multivibrator, said fixed frequency oscillator, and said bistable means so as to prevent pulses from appearing at the output of said multivibrator whenever the output of said bistable means is positive and simultaneously a pulse appears at the output of said fixed frequency oscillator; means adapted to connect the input of said variable frequency oscillator to a source of input signals; and means connecting the output of said variable frequency oscillator to the input of said bistable means.

13. Apparatus of the class described comprising: a fixed frequency pulse oscillator; a bistable device having an input and an output and being operable to a first and second stable state; a variable frequency pulse oscillator having an input and an output and having a nominal frequency substantially the same as said fixed frequency oscillator, the frequency of said variable frequency oscillator being variable in response to a signal applied to its input; means connecting the outputs of said fixed and variable frequency oscillators to the input of said bistable device so that a pulse from said fixed frequency oscillator switches said bistable device to its first stable state and a pulse from said variable frequency oscillator switches said bistable device to its second stable state; phase comparator means having first and second inputs and an output, said phase comparator means producing an output proportional to the difference in phase between signals applied to its inputs; means connecting the outputs of said fixed and variable frequency oscillators to the first and second inputs of said phase comparator respectively; and means connecting the output of said comparator to the input of said variable frequency oscillator at all times except when an input signal is applied to said variable frequency oscillator.

References Cited in the file of this patent

UNITED STATES PATENTS

| | | |
|---|---|---|
| 2,774,872 | Howson | Dec. 18, 1956 |
| 2,963,648 | Baskin et al. | Dec. 6, 1960 |